(12) United States Patent
Grimaldi et al.

(10) Patent No.: US 11,184,013 B1
(45) Date of Patent: Nov. 23, 2021

(54) DIGITAL PHASE-LOCKED LOOP WITH A DYNAMIC ELEMENT MATCHING CIRCUIT AND A DIGITALLY CONTROLLED OSCILLATOR

(71) Applicant: Infineon Technologies AG, Neubiberg (DE)

(72) Inventors: Luigi Grimaldi, Villach (AT); Giovanni Boi, Villach (AT); Dmytro Cherniak, Villach (AT); Fabio Padovan, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/181,366

(22) Filed: Feb. 22, 2021

(51) Int. Cl.
*H03L 7/099* (2006.01)
*H03L 7/093* (2006.01)

(52) U.S. Cl.
CPC .............. *H03L 7/099* (2013.01); *H03L 7/093* (2013.01)

(58) Field of Classification Search
CPC ................................ H03L 7/099; H03L 7/093
USPC .................................. 327/147–149, 156–158
See application file for complete search history.

(56) References Cited

U.S. PATENT DOCUMENTS

| | | | | |
|---|---|---|---|---|
| 9,935,640 | B1* | 4/2018 | Chan | H03C 3/0925 |
| 10,804,913 | B1* | 10/2020 | Talegaonkar | H04L 7/033 |
| 10,862,427 | B1* | 12/2020 | Chan | H03B 5/1212 |
| 10,895,850 | B1* | 1/2021 | Elkholy | H03M 3/368 |
| 2002/0006776 | A1* | 1/2002 | Hasegawa | H03G 3/3042 455/69 |
| 2003/0133522 | A1* | 7/2003 | Staszewski | H03L 7/0991 375/345 |
| 2003/0210734 | A1* | 11/2003 | Kaku | H04B 3/54 375/148 |
| 2008/0315928 | A1* | 12/2008 | Waheed | H03L 7/0991 327/159 |
| 2012/0249195 | A1* | 10/2012 | Guo | H03L 7/103 327/156 |
| 2012/0252382 | A1* | 10/2012 | Bashir | H03F 3/217 455/114.3 |
| 2014/0219391 | A1 | 8/2014 | Mahoney et al. | |
| 2015/0145567 | A1* | 5/2015 | Perrott | G04F 10/005 327/156 |
| 2015/0312078 | A1* | 10/2015 | Bogdan | H03L 7/00 375/226 |
| 2016/0308698 | A1* | 10/2016 | Talty | H03M 3/438 |
| 2016/0315794 | A1* | 10/2016 | Talty | H04B 14/06 |
| 2017/0187401 | A1 | 6/2017 | Talty et al. | |
| 2017/0214408 | A1* | 7/2017 | Liang | H03M 1/1009 |

(Continued)

*Primary Examiner* — Adam D Houston
(74) *Attorney, Agent, or Firm* — Slater Matsil, LLP

(57) ABSTRACT

A method of operating a phase-locked loop (PLL) having a dynamic element matching (DEM)-driven digitally controlled oscillator (DCO) includes calibrating the PLL, where calibrating the PLL includes opening a loop of the PLL and performing linearity measurements of the DEM-driven DCO when the loop of the PLL is open and when dynamic matching of the DEM-driven DCO is activated, where performing the linearity measurements includes: applying test control words to the DEM-driven DCO to obtain frequencies in a first range of frequencies; and measuring output frequencies of the DEM-driven DCO corresponding to the test control words. Calibrating the PLL further includes calculating calibration information based on the test control words and the measured output frequencies.

22 Claims, 12 Drawing Sheets

(56) References Cited

U.S. PATENT DOCUMENTS

| | | | |
|---|---|---|---|
| 2018/0102782 A1* | 4/2018 | Shanan | H03B 5/1841 |
| 2018/0181077 A1* | 6/2018 | Salle | G04F 10/005 |
| 2019/0131992 A1 | 5/2019 | Ali et al. | |
| 2019/0280698 A1* | 9/2019 | Kearney | H03C 3/0925 |
| 2020/0067514 A1* | 2/2020 | Galton | H03L 7/0991 |
| 2020/0389175 A1* | 12/2020 | Gupta | H03L 7/0992 |
| 2021/0126584 A1* | 4/2021 | Perin | H03C 3/0966 |
| 2021/0184686 A1* | 6/2021 | Grout | H03L 7/0995 |

* cited by examiner

DIGITAL PHASE-LOCKED LOOP WITH A DYNAMIC ELEMENT MATCHING CIRCUIT AND A DIGITALLY CONTROLLED OSCILLATOR

TECHNICAL FIELD

The present invention relates generally to systems and methods for digital phase-locked loops (PLLs).

BACKGROUND

Applications in the millimeter-wave frequency regime have gained significant interest recently due to the rapid advancement in low-cost semiconductor technologies such as silicon germanium (SiGe) and fine geometry complementary metal-oxide semiconductor (CMOS) processes. Availability of high-speed bipolar and metal-oxide semiconductor (MOS) transistors has led to a growing demand for integrated circuits for mm-wave applications at 60 GHz, 77 GHz, and 80 GHz and also beyond 100 GHz. Such applications include, for example, automotive radar and multi-gigabit communication systems.

In some radar systems, the distance between the radar and a target is determined by transmitting a frequency modulated signal, receiving a reflection of the frequency modulated signal, and determining a distance based on a time delay and/or frequency difference between the transmission and reception of the frequency modulated signal. Resolution, accuracy, and sensitivity of the radar system may depend, in part, on the linearity and phase noise performance of the radar's frequency generation circuitry, which generally includes a digital phase-locked loop (PLL) with an RF oscillator (e.g., a digitally controller oscillator) and circuitry that controls the frequency of the RF oscillator.

As the operating frequencies of RF systems continue to increase, however, the generation of signals at such high frequencies poses a major challenge. There is a need in the art for PLL system with improved performance (e.g., linearity and phase noise performance).

SUMMARY

In accordance with an embodiment of the present invention, a method of operating a phase-locked loop (PLL) comprising a dynamic element matching (DEM)-driven digitally controlled oscillator (DCO) includes calibrating the PLL, wherein the calibrating includes opening a loop of the PLL and performing linearity measurements of the DEM-driven DCO when the loop of the PLL is open and when dynamic matching of the DEM-driven DCO is activated, wherein performing the linearity measurements comprises: applying test control words to the DEM-driven DCO to obtain frequencies in a first range of frequencies; and measuring output frequencies of the DEM-driven DCO corresponding to the test control words. The calibrating further includes calculating calibration information based on the test control words and the measured output frequencies.

In accordance with an embodiment of the present invention, a method of operating a phase-locked loop (PLL) includes calibrating a digitally controlled oscillator (DCO) of the PLL, wherein the calibrating comprises: setting the PLL in an open-loop operation mode; encoding a first plurality of frequency control words using a dynamic element matching (DEM) circuit to generate first encoded frequency control words; transferring the first encoded frequency control words to the DCO; measuring first output frequencies of the DCO corresponding to the first plurality of frequency control words; and generating a first plurality of correction data based on the first plurality of frequency control words and the measured first output frequencies of the DCO. The method further includes after the calibrating, operating the PLL in a closed-loop operation mode using the first plurality of correction data.

In accordance with an embodiment of the present invention, a digital phase-locked loop (PLL) system includes: a dynamic element matching (DEM) circuit, wherein the DEM circuit is configured to: receive, at an input of the DEM circuit, a frequency control word; and generate, at an output of the DEM circuit, a scrambled frequency control word by encoding and scrambling the frequency control word; a digitally controlled oscillator (DCO), wherein the DCO is configured to receive, at an input of the DCO, the scrambled frequency control word from the DEM circuit, and is configured to output a frequency signal at an output of the DCO; and a digital circuitry configured to generate, in a closed-loop mode, the frequency control word based on at least a PLL modulation input signal and stored calibration information.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently disclosed embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention. Throughout the discussion herein, unless otherwise specified, the same or similar numerals in different figures refer to the same or similar component.

The present invention will be described with respect to example embodiments in a specific context, namely phase-locked loop (PLL) systems with digitally controlled oscillators (DCOs) and dynamic element matching (DEM) circuits.

In direct Frequency and Phase Modulation (FM) applications, the linearity of the digitally controlled oscillator (DCO) directly impacts the performance and complexity of the FM-system. For example, in communication applications, DCO nonlinearity produces unwanted spectral regrow and Error Vector Magnitude (EVM) degradation. In Frequency-Modulated Continuous Wave (FMCW) applications, DCO non-linearity results in range/velocity/angle measurement uncertainty as well as unwanted spurious content (e.g., ghost targets).

In FMCW radar applications, an ideal output frequency of the DCO should be a linear ramp over time. However, the characteristics of the generated frequency versus the frequency control word (e.g., a control word indicating a capacitance of the DCO) for the DCO can be strongly nonlinear, and the non-linearity may result from the topology and physics of the capacitors used in the DCO. Moreover, the natural frequency of an LC circuit is $\omega=1/\sqrt{LC}$, therefore, even if the capacitor C can change linearly with time, the characteristic of the frequency generated is still subject to the square root law.

Pre-distortion processing may be performed in order to achieve improved linear relationship between the digital control word and the output frequency of the DCO. Conventional pre-distortion processing, however, may require extensive DCO characteristics measurements and complicated compensation mechanism, which may increase the complexity and calibration time of the DCO. Another challenge for pre-distortion processing is code-dependent nonlinearity, meaning that a different pattern (e.g., a sequence of digital control words) at the DCO input could result in a different integral non-linearity (INL) profile, which would require a different set of non-linearity correction coefficients. Various embodiments disclosed herein allows for improved calibration time for the DCO, and allows for a single set of non-linearity correction coefficients to be used for different patterns at the input of the DCO.

Figure 1:
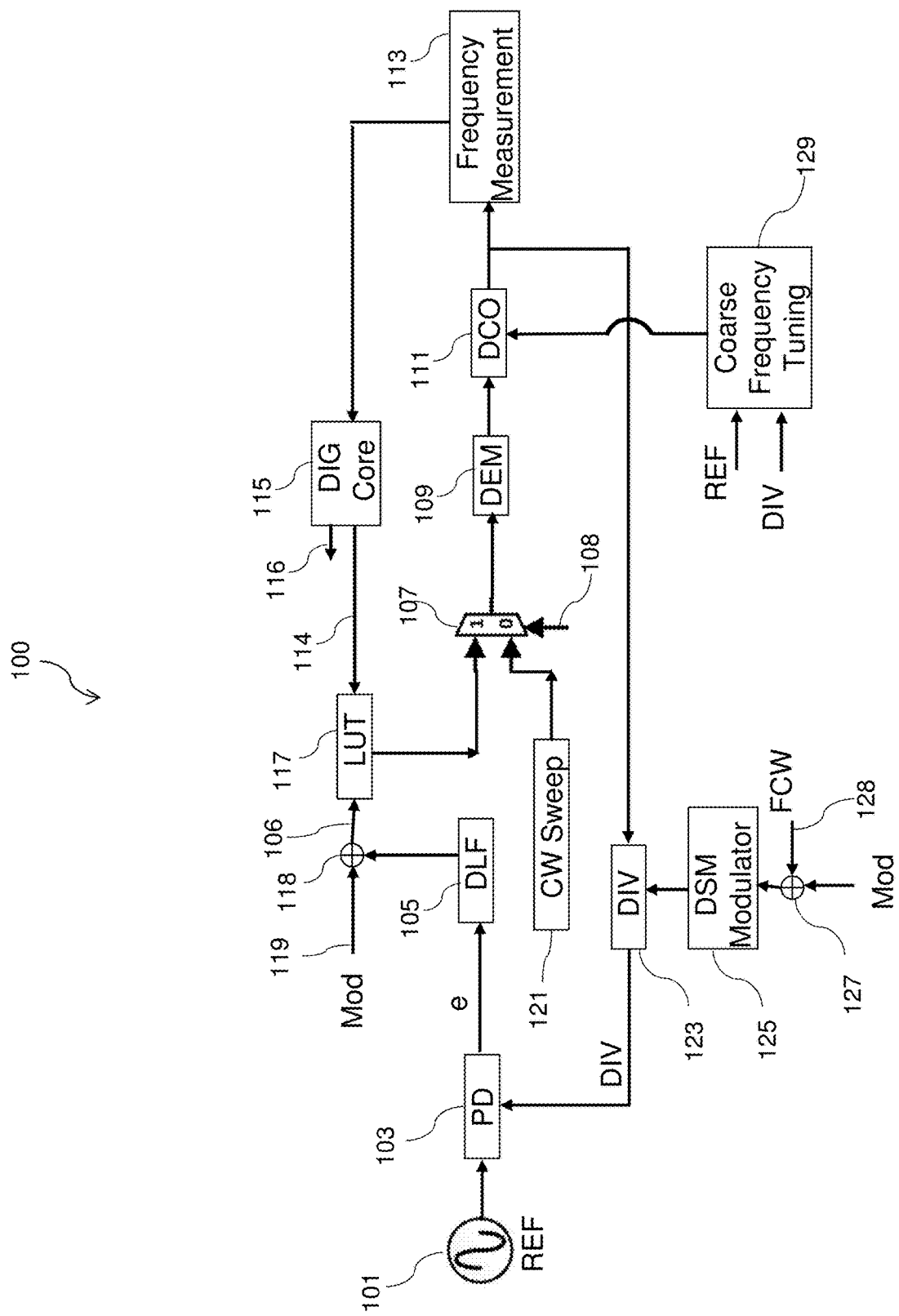
FIG. 1 illustrates a schematic diagram of a phase-locked loop (PLL) system, in an embodiment.

FIG. 1 illustrates a schematic diagram of a phase-locked loop (PLL) system 100, in an embodiment. The PLL system 100 includes a digitally controlled oscillator (DCO) 111 and a dynamic element matching circuit (109) coupled to the DCO 111. The DCO 111 may have one or more programmable capacitor banks, where each of the programmable capacitor banks has a plurality of programmable capacitors and is controlled by a respective frequency control word. For example, a first capacitor bank of the DCO may be controlled by a first frequency control word generated by the DEM circuit 109, and a second capacitor bank of the DCO may be controlled by a second frequency control word from a coarse frequency tuning circuit 129, or vice versa. Example embodiments of the DCO 111 are discussed in detail with reference to FIGS. 3A and 3B.

Figure 2:
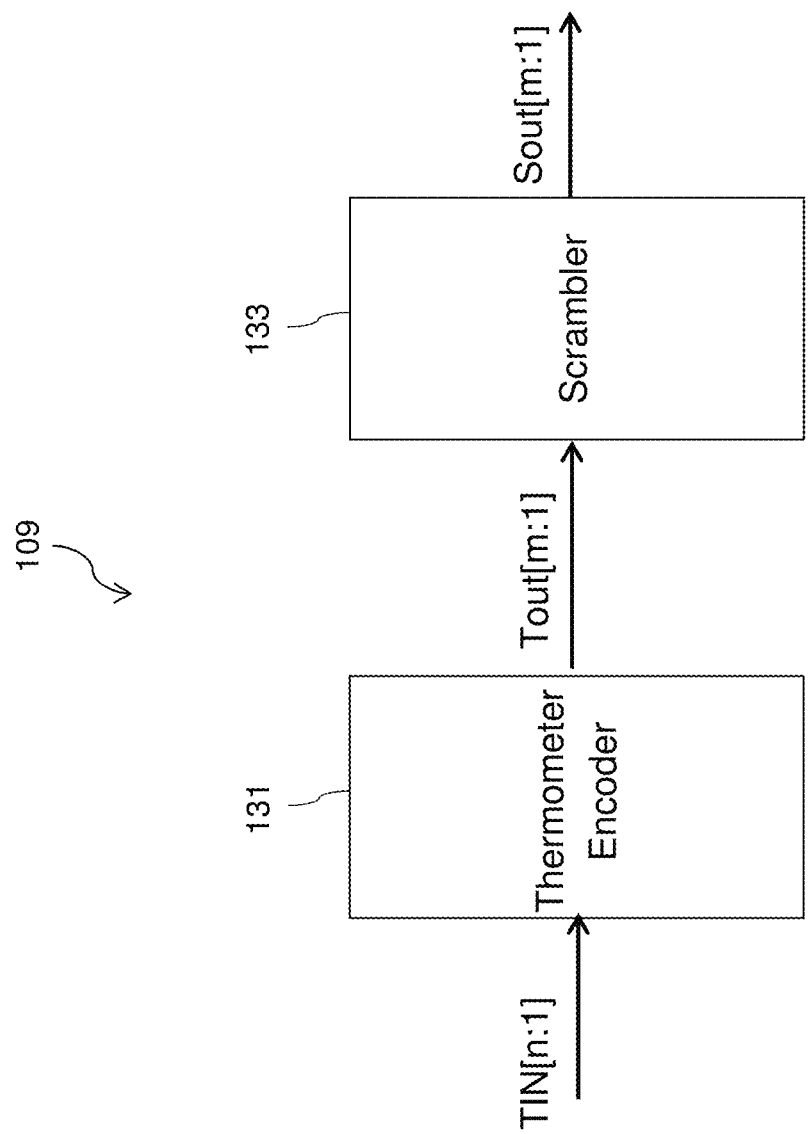
FIG. 2 illustrates a block diagram of a dynamic element matching (DEM) circuit, in an embodiment.

Referring temporarily to FIG. 2, which illustrates an example block diagram of the DEM circuit 109. In the example of FIG. 2, the DEM circuit 109 includes a thermometer encoder 131 and a scrambler 133. The thermometer encoder 131 converts (e.g., encodes) an n-bit input word TIN[n:1] into an m-bit thermometer code Tout[m:1]. The thermometer code Tout[m:1] is then sent to the scrambler 133. The scrambler 133 scrambles Tout[m:1] to generate a scrambled m-bit output Sout[m:1]. In some embodiments, the scrambler 133 routes (e.g., maps) each bit of Tout[m:1] to a respective bit of the scrambled output Sout[m:1]. The bit mapping between Tout[m:1] and Sout[m:1] changes, e.g., at each clock cycle of a clock signal, such that for a sequence of thermometer codes sent to the scrambler 133, each of the sequence of thermometer codes has a different bit mapping. The scrambler 133 may be implemented using any scrambler circuits known in the art. For example, the scrambler 133 may be implemented using a plurality of multiplexer circuits that is controlled by a linear feedback shift register. Alternatively, other scrambler implementations may be used.

Referring back to FIG. 1, the input of the DEM circuit 109 is coupled to an output of a multiplexer 107. As illustrated in FIG. 1, a first input of the multiplexer 107 is coupled to an output of a look-up table (LUT) 117, and a second input of the multiplexer 107 is coupled to an output of a control word (CW) sweeping circuit 121. As will be discussed in detail hereinafter, the CW sweeping circuit 121 generates a sequence of test control words (e.g., a sequence of frequency control words) during calibration of the DCO 111. The LUT 117 is or comprises a memory device (e.g., a non-volatile memory) that stores a plurality of calibration data (may also be referred to as a plurality of calibration coefficients, a plurality of correction data, or a plurality of correction coefficients) configured to correct nonlinearities of the DCO 111, in some embodiments. Therefore, the LUT 117 functions as a pre-distortion processing block to correct (e.g., compensate for) the nonlinearities of the DCO 111. In some embodiments, the plurality of calibration data stored in the LUT 117 is generated by a digital core 115 during calibration of the DCO 111, based on the test control words and output frequencies measured by a frequency measurement circuit 113. After being generated, the plurality of calibration data is transferred from the digital core 115 to the LUT 117 through a data path 114 and stored in the LUT 117. Details of the calibration of the DCO 111 are discussed hereinafter with reference to FIGS. 4, 5A, 5B, 6, and 7.

Still referring to FIG. 1, an input terminal 106 of the LUT 117 is coupled to an output of an adder 118. During normal operation (e.g., closed-loop operation mode) of the PLL system 100, based on the input signal (e.g., a frequency control word) at the input terminal 106, the LUT 117 outputs a calibration data (e.g., a correction coefficient) corresponding to the input signal. The adder 118 sums a PLL modulation input (labeled as Mod in FIG. 1) at an input terminal 119 and an output of a loop filter 105 of the PLL system 100. The loop filter 105 may be any suitable loop filter known and used in a PLL system 100, thus detail are not discussed here.

The input of the loop filter 105 is coupled to an output of a phase error detector 103. A first input of the phase error detector 103 is coupled to a reference frequency signal 101 (e.g., a reference frequency signal with fixed output frequency), and a second input of the phase error detector 103 is coupled to an output of a programmable frequency divider 123. The programmable frequency divider 123 is configured to divide the frequency signal at the output of the DCO 111 by a dividing factor, which dividing factor is determined by an output of a Delta-Sigma Modulator 125. In FIG. 1, an input of the Delta-Sigma Modulator 125 is coupled to an output of an adder 127, which adder 127 sums the PLL modulation input (labeled as Mod in FIG. 1.) and a frequency control word 128. The frequency control word 128 corresponds to a carrier frequency of the PLL system 100. The use of Delta-Sigma Modulator 125 allows for a non-integer dividing factor for the programmable frequency divider 123. Delta-Sigma modulators are known and used in the art, thus details are not discussed here. FIG. 1 further illustrates a coarse frequency tuning circuit 129, which is used to determine the carrier frequency of the PLL system 100. Details regarding the carrier frequency of the PLL system 100 are discussed hereinafter with reference to FIGS. 5A and 5B.

Figure 3A:
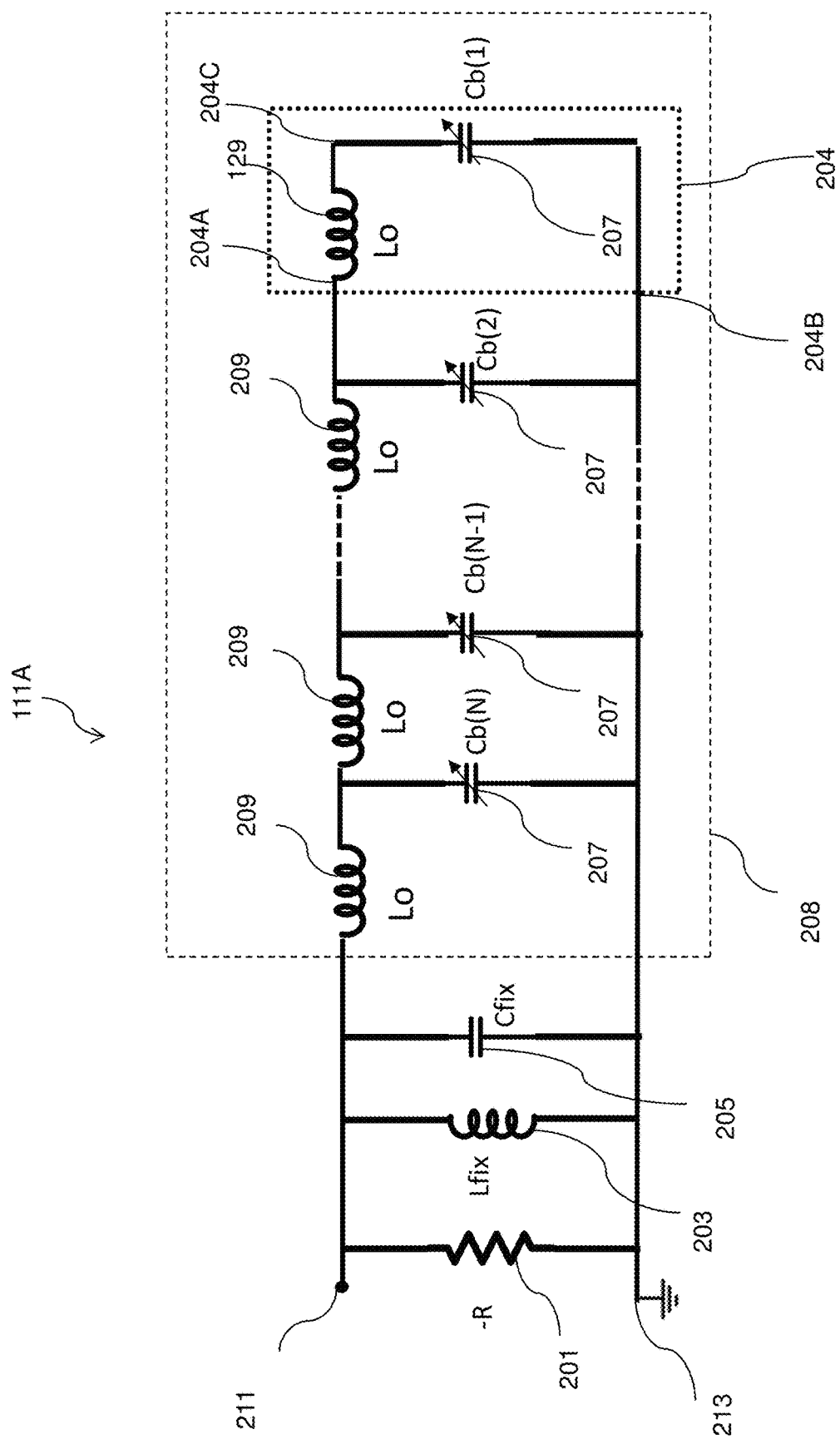
FIG. 3A illustrates a schematic diagram of a digitally controlled oscillator (DCO), in an embodiment.

FIG. 3A illustrates a schematic diagram of a digitally controlled oscillator (DCO) 111A, in an embodiment. The DCO 111A may be used as the DCO 111 in FIG. 1. The DCO 111A includes an inductor 203 (e.g., a fixed inductor) and a capacitor 205 (e.g., a fixed capacitor) coupled in parallel. The capacitor 205 is optional, and therefore, may be omitted. The DCO 111A further includes a programmable capacitor bank 208 coupled between terminals of the inductor 203. The output terminals 211 and 213 of the DCO 111A are coupled to the terminals of the capacitor 205 (or terminals of the inductor 203). In the example of FIG. 3A, the DCO 111A further includes an active device 201 (e.g., a transistor) coupled between the output terminals 211 and 213. The active device 201 may be used for maintaining oscillation of the DCO 111A by injecting energy into the LC tank circuit formed by the inductor 203, the capacitor 205 (if present), and the programmable capacitor bank 208. Therefore, a label of negative resistance (e.g., −R) is used in FIG. 3A to indicate that device 201 is an active device.

In FIG. 3A, the programmable capacitor bank 208 includes a plurality of cells 204 (may also be referred to as capacitor cells) concatenated together to form a ladder-shaped topography. Each of the cells 204 includes an inductor 209 (e.g., a fixed inductor) and a programmable capacitor 207. The inductor 209 is coupled between a node 204A and a node 204C of the cell 204, and the programmable capacitor 207 is coupled between the node 204C and a node 204B of the cell 204.

In the example of FIG. 3A, the cells 204 in the programmable capacitor bank 208 are the same (e.g., having the same structure and same parameters for the electrical components in the cells). In other words, the inductors 209 (e.g., fixed inductors) of the cells 204 have a same inductance value (e.g., an inductance value of L0), and the programmable capacitors 207 of the cells 204 have the same programmable values (e.g., same maximum capacitance values and same minimum capacitance values). For example, each of the programmable capacitors 207 may have two different capacitance values (e.g., a maximum capacitance value and a minimum capacitance value), depending on, e.g., the frequency control word used to set (e.g., program) the programmable capacitors 207, each of the programmable capacitors 207 has either the maximum capacitance value or the minimum capacitance value. In some embodiments, the frequency control word for the DCO 111A is thermometer coded, and each of the programmable capacitors 207 is controlled (e.g., programmed, or set) individually, e.g., by a different bit of the thermometer coded frequency control word. For example, the thermometer coded frequency control word may have moo bits, with each bit controlling the capacitance value of a respective programmable capacitor 207 in the programmable capacitor bank 208.

The number of cells 204 in the programmable capacitor bank 208 may depend on the design of the DCO 111A and may be any suitable number. For example, the number of cells 204 in the programmable capacitor bank 208 may be between about 50 and about 5000, such as about 600. The inductors 209 in the programmable capacitor bank 208 are used to improve the linearity characteristics of the DCO 111A, and therefore, the inductance of each inductor 209 is much smaller than the inductance of the inductor 203 to not affect the frequency of the DCO 111A in any significant way (e.g., change the frequency by less than 10%). In some embodiments, an inductance of the inductor 203 is larger than a sum of the inductances of all of the inductors 209 in the programmable capacitor bank 208. In some embodiments, the inductance of the inductor 203 is between about 5 times and about 500 times of the sum of the inductances of all of the inductors 209 in the programmable capacitor bank 208. Therefore, the inductor 203 may also be referred to as a main inductor. U.S. patent applicant Ser. No. 17/064,378 discloses various embodiments of DCOs with programmable capacitor bank(s), which application is incorporated herein by reference.

Figure 3B:
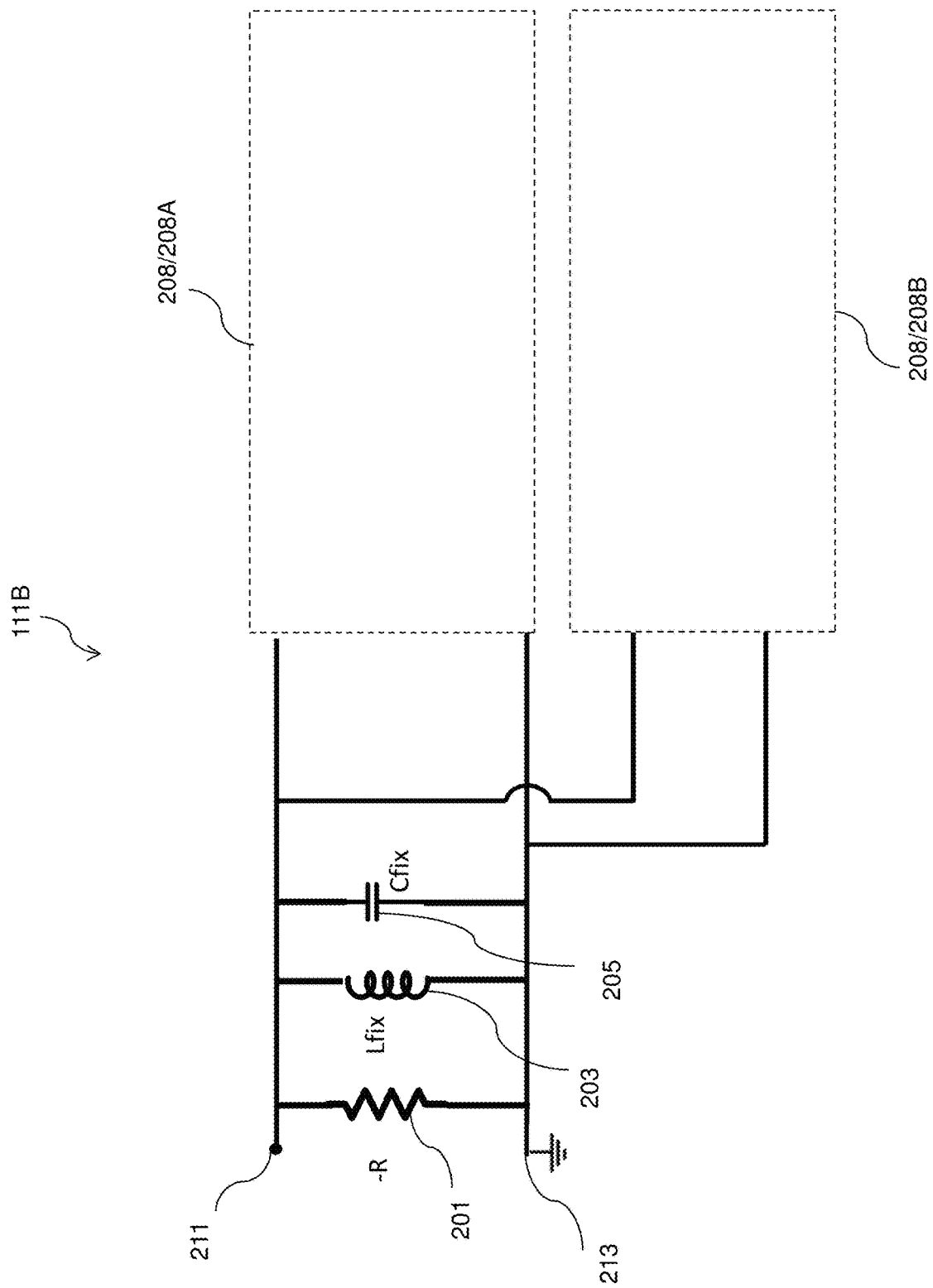
FIG. 3B illustrates a schematic diagram of a digitally controlled oscillator (DCO), in another embodiment.

FIG. 3B illustrates a schematic diagram of a digitally controlled oscillator (DCO) 111B, in another embodiment. The DCO 111B may be used as the DCO iii in FIG. 1. The DCO 111B is similar to the DCO 111A of FIG. 3A, but with additional programmable capacitor banks 208. For example, besides a first programmable capacitor bank 208/208A, a second programmable capacitor bank 208/208B is coupled in parallel to the first capacitor bank 208/208A. Details of the first and second programmable capacitor banks 208A and 208B are the same as or similar to the programmable capacitor bank 208 in FIG. 3A, thus are not repeated here. Therefore, the first and the second programmable capacitor banks 208A and 208B are shown as boxes in FIG. 3B. Note that although two programmable capacitor banks (e.g., 208A, 208B) are illustrated in FIG. 3B, more than two programmable capacitor banks may be formed and coupled in parallel in the DCO 111B, as skilled artisans readily appreciate.

In some embodiments, each of the programmable capacitor banks (e.g., 208A, 208B) may be controlled separately by a respective frequency control word. In the illustrated embodiments, all of the programmable capacitors 207 in the programmable capacitor banks are coupled in parallel. Therefore, the total capacitance of the programmable capacitor banks (e.g., 208A, 208B) is equal to the sum of all the programmable capacitors 207 in the programmable capacitor banks. By controlling (e.g., setting, or adjusting) the capacitance values for the programmable capacitors 207 using the frequency control words, the output frequency of the DCO (e.g., 111B) is adjusted accordingly. For example, in an FMCW radar application, the first programmable capacitor banks 208A may be controlled by a first frequency control word (e.g., a fixed frequency control word) to select a carrier frequency (e.g., a center frequency of an operating frequency band) of the DCO 111B, and the second programmable capacitor banks 208B may be controlled by a second frequency control word (e.g., a PLL modulation input that changes over time) to generate a linear frequency ramp signal around the carrier frequency. Details of selecting the carrier frequency and generating the linear frequency ramp signal are discussed hereinafter.

Ideally, the cells 204 of the programmable capacitor bank 208 are the same (e.g., having a same inductor 209 and a same programmable capacitor 207). In practice, however, due to variations in manufacturing, the cells 204 may have differences, resulting in mismatch of the cells 204. The mismatch of cells 204 causes non-linearity of the DCO, e.g., may degrade the differential non-linearity (DNL) performance of the DCO and pose severe limitation to the PLL system performance in the closed-loop operation mode, and may cause, e.g., appearance of spurs and increase of noise floor.

High performance DCOs are typically used for applications requiring state of the art spurious free dynamic range (SFDR). The DCO's non-linearity degrades the system performance, especially in a PLL system, where the DCO is employed as a modulator, e.g., for frequency modulation (FM) and/or phase modulation (PM). In addition, the natural frequency of an LC circuit is $\omega=1/\sqrt{LC}$, therefore, even if the cells 204 are the same, the characteristic of the frequency generated may still subject to the square root law. Furthermore, as discussed previously, the code-dependent non-linearity of the DCO would require different sets of non-linearity correction coefficients for different input sequences of frequency control words.

Referring back to FIG. 1 temporarily, to overcome the above mentioned issues, the embodiment method disclosed herein performs a calibration of the DCO 111 in open-loop mode while the DEM circuit 109 is activated. The calibration process performs a linearity measurement of the DCO 111 by measuring the output frequencies of the DCO 111 in response to a plurality of test control words (e.g., a plurality of frequency control words) generated by the CW sweeping circuit 121. Note that the test control words are encoded and scrambled by the DEM circuit 109 during the calibration process. Based on the linearity measurements, a plurality of calibration data (e.g., correction coefficients) are calculated which compensate for the non-linearity of the DCO. The plurality of calibration data is stored in the LUT 117. In some embodiments, at the beginning of the calibration process, a coarse frequency tuning process, which is optional, may be performed to determine the carrier frequency (e.g., a center frequency of an operating frequency band) of the DCO 111. After the calibration mode is finished, the PLL system 100 enters the closed-loop operation mode. In the closed-loop operation mode, a frequency control word is first modified by a corresponding calibration data, before the frequency control word is sent to the DEM circuit 109 to control the DCO 111.

During the calibration process, the DEM circuit 109 shapes the mismatch-induced error in frequency and pushes the mismatch-induced error outside the bandwidth of interest. This is achieved by means of Dynamic Element Matching (DEM) technique, which generates a scrambling pattern that is different every time to reshape the mismatch-induced error. In some embodiments, the reshaped mismatch-induced error is a high-frequency error, and may be removed easily by filtering (e.g., low-pass filtering, averaging, or polynomial fitting of the measured frequencies during calibration). The issue of code-dependent non-linearity may be understood from the DCO structure depicted in, e.g., FIG. 3A. In FIG. 3A, each programmable capacitor 207, depending on its position inside the programmable capacitor bank 208, experiences a different inductance (e.g., caused by the inductors 209), thus depending on the programmable capacitors 207 selected by the bits of the thermometer coded frequency control word, different equivalent total capacitances of the programmable capacitor bank 208 will be achieved for different frequency control words. The DEM circuit 109, by scrambling (e.g., randomizing) the bit mapping of the scrambler 133 each time, breaks up the code-dependency, thus producing a non-linearity profile which is always the same (e.g. independent from the input sequence of frequency control words) and can be corrected by fixed correction coefficients.

After the calibration is performed, in the closed-loop operation mode, the DCO 111 is still driven by the DEM circuit 109, which generates a constant non-linearity profile of the DCO 111, meaning that the non-linearity correction coefficients saved in the LUT 117 will effectively compensate for the residual non-linearity. Details of the calibration process and the closed-loop operation mode of the PLL system 100 are discussed hereinafter.

Figure 4:
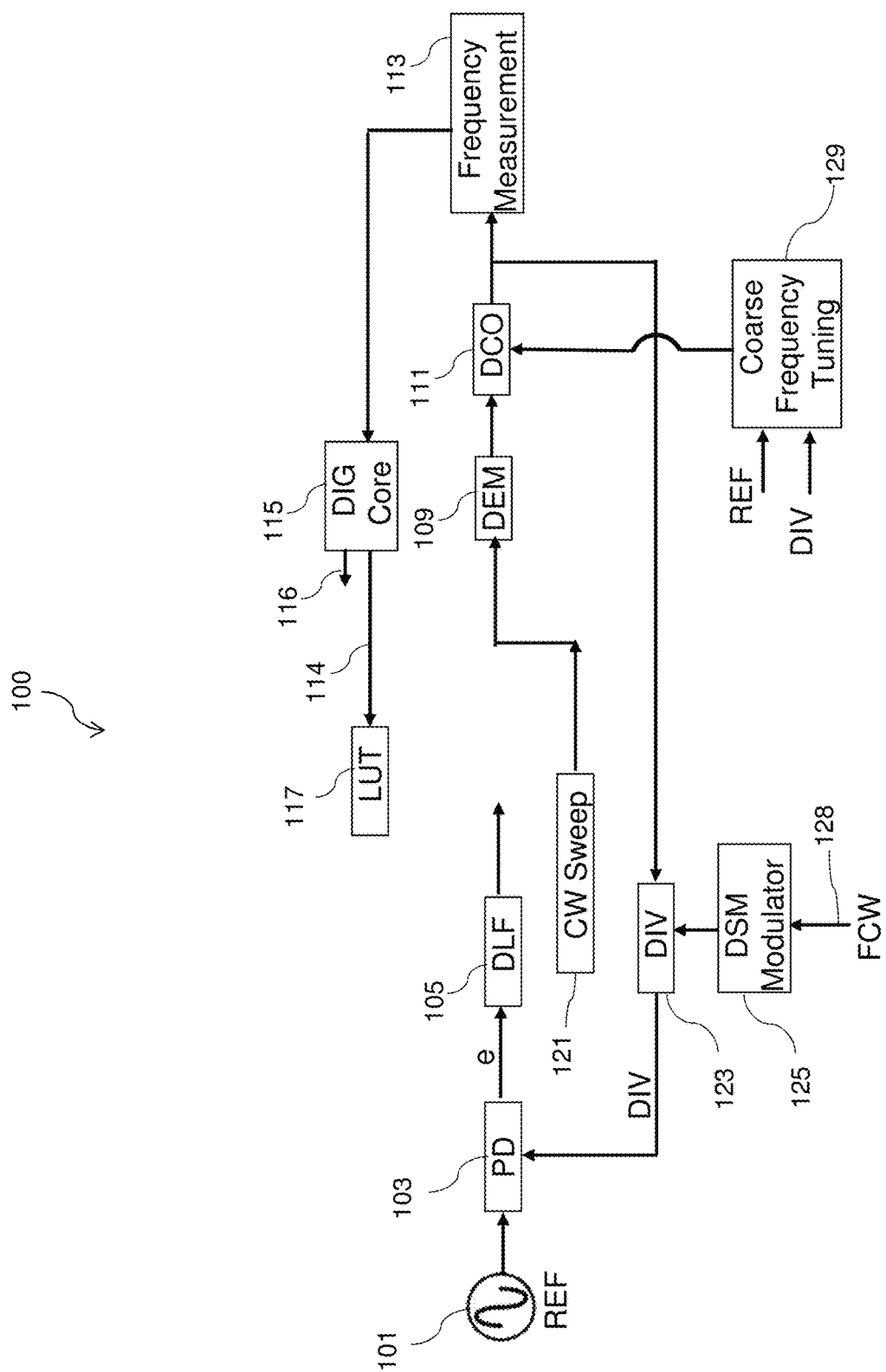
FIG. 4 illustrates an equivalent schematic diagram of the PLL system of FIG. 1 in an open-loop calibration mode.

FIG. 4 illustrates an equivalent schematic diagram of the PLL system 100 of FIG. 1 in the open-loop calibration mode (also referred to as a calibration mode). In "open-loop" means the forward path of the main loop of the PLL system 100, which includes the phase error detector 103, the loop filter 105, the DEM circuit 109, and the DCO 111, is open. In the illustrated embodiment, to enter the calibration mode, the control signal 108 (see FIG. 1) of the multiplexer 107 is set to a value such that the output of the CW sweep circuit 121 is passed through the multiplexer 107 and sent to the input of the DEM circuit 109. During the calibration mode, no PLL modulation input is sent to the input terminal 119 of the PLL system 100.

At the beginning of the calibration mode, a coarse frequency tuning process is performed by the coarse frequency tuning circuit 129 to determine the carrier frequency of the DCO 111. The coarse frequency tuning process is optional, and may be omitted in some embodiments. The coarse frequency tuning circuit 129 may be any suitable frequency tuning circuit known and used for PLL systems, thus details are not discussed here. As illustrated in FIG. 4, input signals to the coarse frequency tuning circuit 129 includes the reference frequency signal 101 (labeled as REF in FIG. 4) and the output of the programmable frequency divider 123 (labeled as DIV in FIG. 4). In some embodiments, the coarse frequency tuning circuit 129 forms a close loop with the DCO 111 to achieve frequency lock at a target carrier frequency, and the frequency control word used to achieve the frequency lock is read out and used to set the carrier frequency for both the open-loop calibration mode and the closed-loop operation mode. The effect of the choice of the carrier frequency is described below with reference to FIGS. 5A and 5B.

Figure 5:
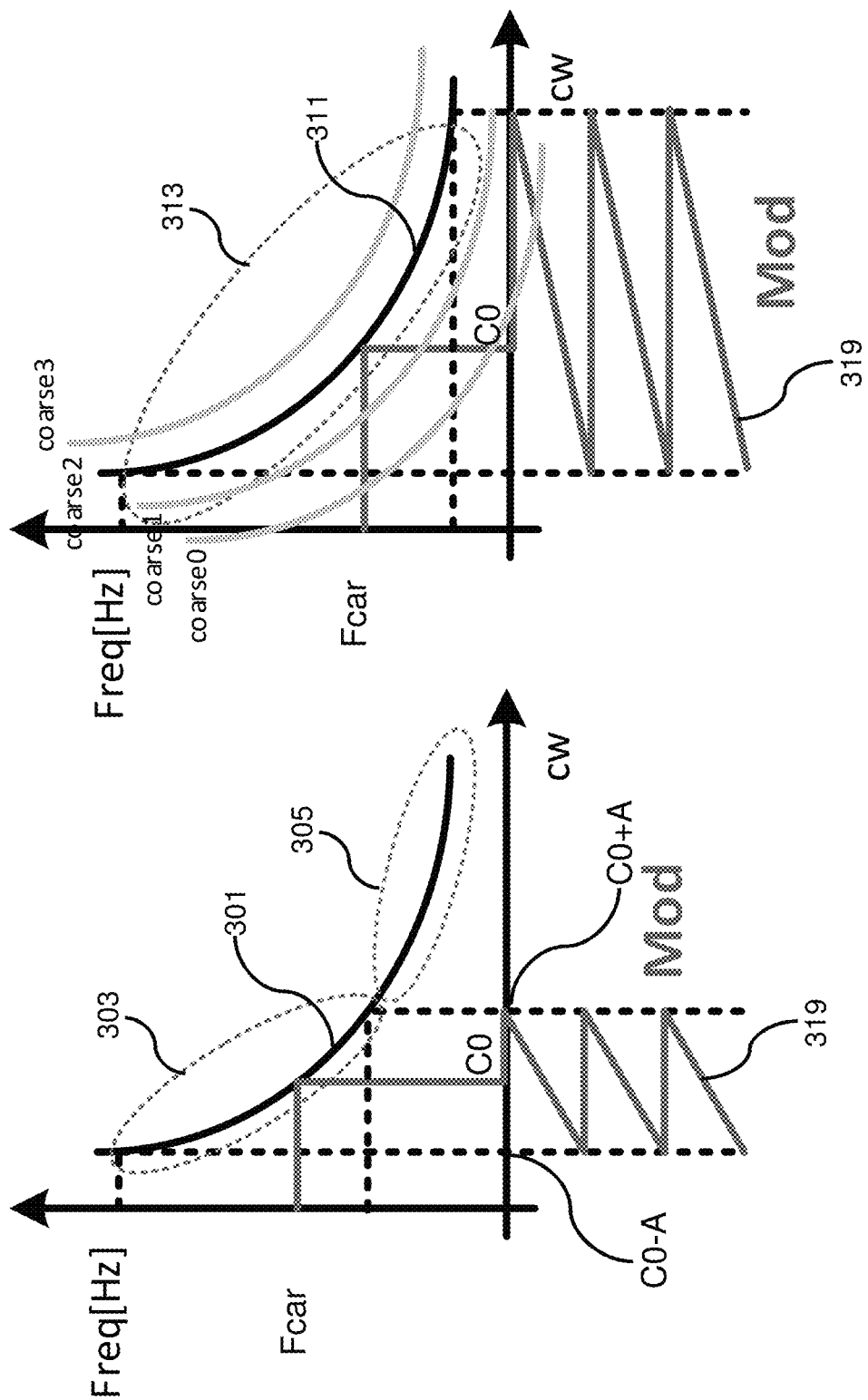
FIGS. 5A and 5B illustrate the impact of carrier frequency selections on the performance of DCOs, in some embodiments.

FIGS. 5A and 5B illustrate the impact of carrier frequency selections on the performance of DCOs, in some embodiments. In FIG. 5A, the curve 301 illustrates the output frequency of a DCO (e.g., DCO 111A) versus the input frequency control word. In the example of FIG. 5, the carrier frequency Fcar corresponds to a frequency control word $C_0$. FIG. 5A further illustrates a saw-tooth shaped (or zigzag shaped) line 319, which illustrates the PLL modulation input applied to the input terminal 119 in FIG. 1 during the closed-loop operation mode. The example of FIG. 5A may illustrate the operation of an FMCW radar, where the radar operates at the carrier frequency Fcar (e.g., a center frequency of an operating frequency band of the radar), and the PLL modulation input, which varies linearly over time (e.g., in the zigzag pattern) between a value of −A and +A, is added to the frequency control word $C_0$ to modulate the output frequency of the DCO, such that the output frequency of the DCO varies over time around the carrier frequency Fcar. Note that by choosing the carrier frequency to be Fcar, the output frequency of the DCO corresponding to the range (e.g., between −A and +A) of the PLL modulation input is within a region 303 indicated by the dashed circle, instead of another region, such as region 305. Due to the curve 301 in the region 303 being steeper (e.g., the gradient of the curve having a larger absolute value) than the region 305, the same range of PLL modulation input results in a wider range for the DCO output frequency. In the example of FIG. 5A, the frequency band within the region 303 (e.g., corresponding to frequency control words ranging from $C_0$–A to $C_0$+A) is referred to as the operating frequency band the PLL system.

FIG. 5B illustrates the output frequency of a DCO (e.g., DCO 111B) versus the input frequency control word, in some embodiments. In the example of FIG. 5B, the DCO has more than one programmable capacitor banks. For example, if the DCO is the DCO 111B of FIG. 3B, then the first programmable capacitor bank 208A may be controlled by a first frequency control word (e.g., a fixed frequency control word determined by the coarse frequency tuning circuit 129) to select the carrier frequency Fcar of the DCO 111B, and the second programmable capacitor banks 208B may be controlled by a second frequency control word (e.g., the PLL modulation input that changes over time in the zigzag pattern as shown by the line 319) to generate a frequency sweep signal around the carrier frequency Fcar. Note that a plurality of frequency response curves (labeled coarse0, coarse 1, coarse 2, and coarse 3) are illustrated in FIG. 5B, each of the curves corresponding to a different setting (e.g., a different frequency control word such as coarse 0, coarse1, coarse2, or coarse3) for the first programmable capacitor bank 208A. The coarse frequency tuning circuit 129 therefore determines, e.g., an optimum setting for the first programmable capacitor bank 208A such that the frequency control word $C_0$ for the second programmable capacitor bank 208B corresponds to a carrier frequency Fcar at the center of the operating frequency band, thus maximizing the usable frequency range for frequency modulation. In the example of FIG. 5B, the optimum setting determined by the coarse frequency tuning circuit 129 for the first programmable capacitor bank 208A corresponds to the "coarse2" setting. The operating frequency band for the example of FIG. 5B is the frequency band within the region 313. In the above examples, the carrier frequency Fcar is the center of the operating frequency band. This is, of course, merely an example and non-limiting. The carrier frequency Fcar may be any suitable frequency within the operating frequency band.

Referring back to FIG. 4, in some embodiments, during the calibration mode, after the carrier frequency Fcar is determined by the coarse frequency tuning circuit 129, the first programmable capacitor bank 208A of the DCO 111 is set with the optimum setting (e.g., coarse2) such that the frequency control word $C_0$ corresponds to the carrier frequency Fcar. Next, linearity measurement of the DCO 111 is performed while the forward path of the main loop of the PLL system 100 is open. To perform the linearity measurement, the CW sweep circuit 121 sends a sequence of test control words (e.g., a sequence of frequency control words) to the DEM circuit 109, the DEM circuit 109 encodes and scrambles the test control words, and the output of the DEM circuit 109 is sent to the DCO 111 to control its output frequencies. The sequence of test control words correspond to a plurality of DCO output frequencies within the operating frequency band. In other words, values of the sequence of test control words cover a range that includes the frequency control word (e.g., $C_0$) that sets the carrier frequency Fcar. In some embodiments, the number of test control words is equal to the number of programmable capacitors 207 in the programmable capacitor bank 208 that is controlled by the PLL modulation input. For example, in an embodiment where the second programmable capacitor bank 208B (see FIG. 3B) of the DCO 111B is controlled by the PLL modulation input and there are 100 programmable capacitors 207 in the second programmable capacitor bank 208B, the sequence of test control words may include 100 different test control words (e.g., with values from 1 to 100) to cover all of the programmable capacitors 207 in the second programmable capacitor bank 208B.

The output frequencies of the DCO 111 corresponding to the sequence of test control words are measured by the frequency measurement circuit 113. Based on the measured output frequencies and the sequence of test control words, a plurality of calibration data (also referred to as calibration coefficients or correction coefficients) is generated by the digital core 115. The plurality of calibration data may also be collectively referred to as calibration information. The calibration information is configured to correct nonlinearities between the output frequencies of the DCO 111 and the input frequency control words, in some embodiments. Details regarding computation of the calibration information are discussed hereinafter with reference to FIGS. 6 and 7.

The digital core 115 may be, e.g., a micro-processor, or an application specific integrated circuit (ASIC) that computes the calibration information. After the calibration information is computed, the digital core 115 then stores the calibration information in the LUT 117. FIG. 4 further illustrates control terminals 116 of the digital core 115. The control terminals 116 may include control signals that switch the operation mode of the PLL systems, e.g., from the open-loop calibration mode to the closed-loop operation mode. For example, one of the control signal provided by the control terminals 116 may be used as the control signal 108 of the multiplexer 107.

Figure 6:
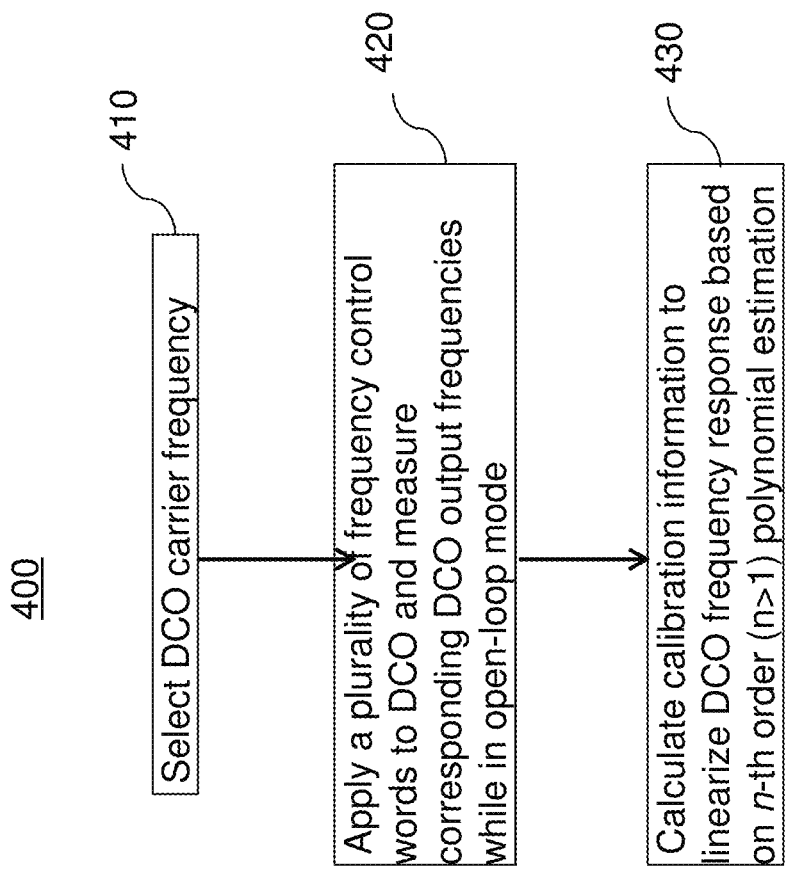
FIG. 6 illustrates a flow chart of a method of calibrating a DCO, in an embodiment.
Figure 7:
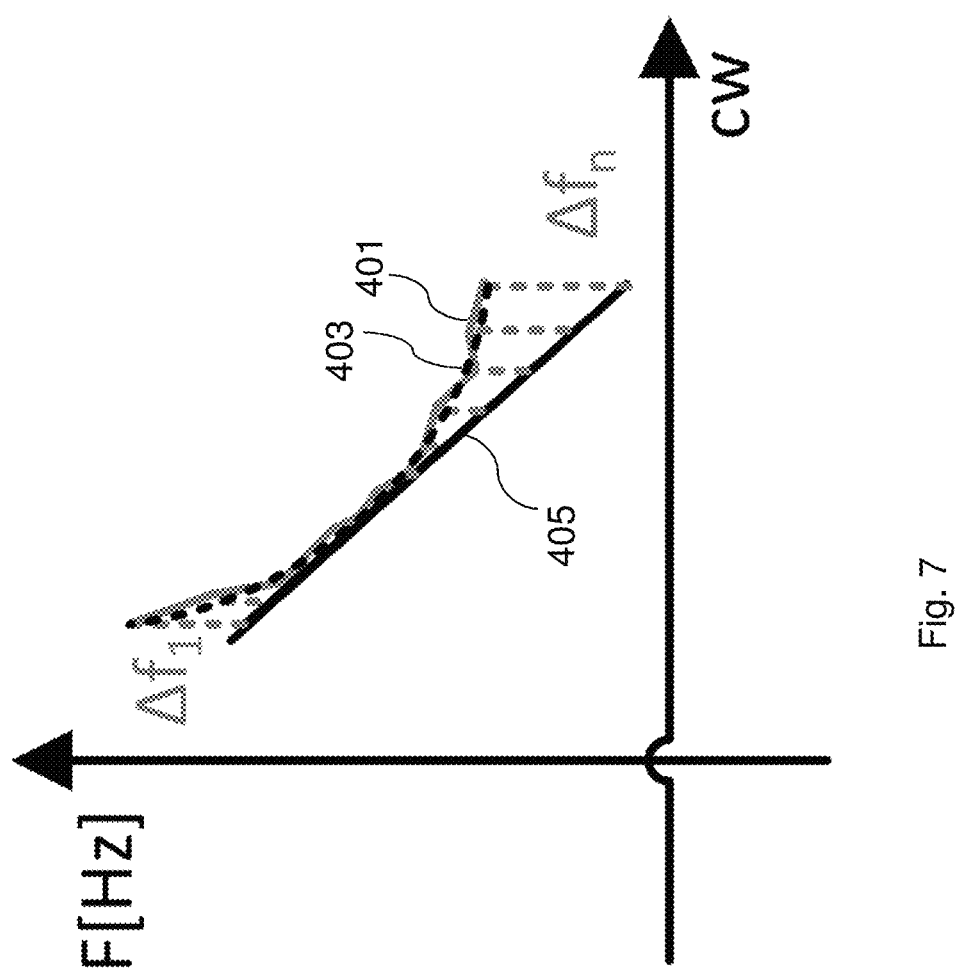
FIG. 7 illustrates frequency response curves generated during calibration of a DCO, in an embodiment.

FIG. 6 illustrates a flow chart of a method 400 for calibrating a DCO of a PLL system to obtain the calibration information for the DCO, in an embodiment. In step 410, the DCO carrier frequency is selected, e.g., by the coarse frequency tuning process discussed above. In step 420, a plurality of frequency control words (e.g., test control words) is applied to the DCO, and the corresponding DCO output frequencies are measured while the PLL system is in the open-loop mode, as discussed above with reference to FIG. 4. In step 430, the calibration information for the DCO is calculated to linearize the DCO frequency response based on n-th order polynomial estimation, where n>1. In some embodiments, to calculate the calibration information, a polynomial fit of the measured DCO output frequencies is performed to generate a clean estimate of the DCO output frequencies. The polynomial used in the polynomial fit process has a polynomial order higher than 1, in some embodiments. Recall that the DEM circuit 109 reshapes the cell mismatch-induced error in frequency and pushes the mismatch-induced error outside the bandwidth of interests, e.g., as a high-frequency noise. The polynomial fit process functions as a low pass filtering process to remove the high-frequency noise to get a clean estimate of the output frequencies of the DCO. FIG. 7 illustrates the effect of the polynomial fit process.

Referring to FIG. 7, the curve 401, which is jagged, represents the measured DCO output frequencies with high-frequency noise. The dashed curve 403, which is smooth, is generated by performing a polynomial fit of the measured DCO output frequencies. The x-axis of FIG. 7 represents the value of the frequency control word (e.g., the test control words), and y-axis represents the DCO output frequency. Since the high-frequency noise is random, the polynomial fit effectively removes the high-frequency noise and achieves a clean estimate of the DCO output frequencies corresponding to the frequency control words.

Once the clean estimate of the DCO output frequencies is obtained, a suitable technique, such as digital pre-distortion technique, may be used to calculate the calibration information. As a simple example, an inverse of the polynomial obtained by the polynomial fit process may be determined and used for calculation of the calibration information. Another example for calculating the calibration information is described below.

In some embodiments, to calculate the calibration information, a linear frequency response curve 405 (see FIG. 7) between the frequency control words and the clean estimate of the DCO output frequencies is generated. The linear frequency response curve 405 is the target linear response for the calibration process. In other words, the calibration information is configured to compensate for the non-linearity of the DCO and to achieve the target linear response. The linear frequency response curve 405 may be generated by, e.g., connecting the first and the last DCO output frequency on the curve 403 (e.g., the clean estimate of DCO output frequencies) to form a line and shifting the line vertically by a suitable value. Besides the method describe above, any suitable method for forming the linear frequency response may be used. These and other modifications are fully intended to be included within the scope of the present disclosure.

Next, frequency errors between the clean estimate of the DCO output frequencies (e.g., the curve 403) and the linear frequency response curve 405 are generated. FIG. 7 illustrates the calculated frequency errors Δf1, . . . , Δfn between each of the frequency control words and the corresponding clean estimate of the DCO output frequency.

Next, a plurality of calibration data for the frequency control words is computed to compensate for the computed frequency errors. In other words, for each frequency control word in FIG. 7, if a respective calibration data is added to the frequency control word to form a modified frequency control word, then the DCO output frequency corresponding to the modified frequency control word should be the same as the frequency of the linear frequency response curve 405 corresponding to the original frequency control word. Therefore, the plurality of calibration data serve as the pre-distortion values for the frequency control words in order to achieve linear response between the DCO output frequencies and the frequency control words. Any suitable techniques may be used for determining the plurality of calibration data, details are not discussed here.

Figure 8:
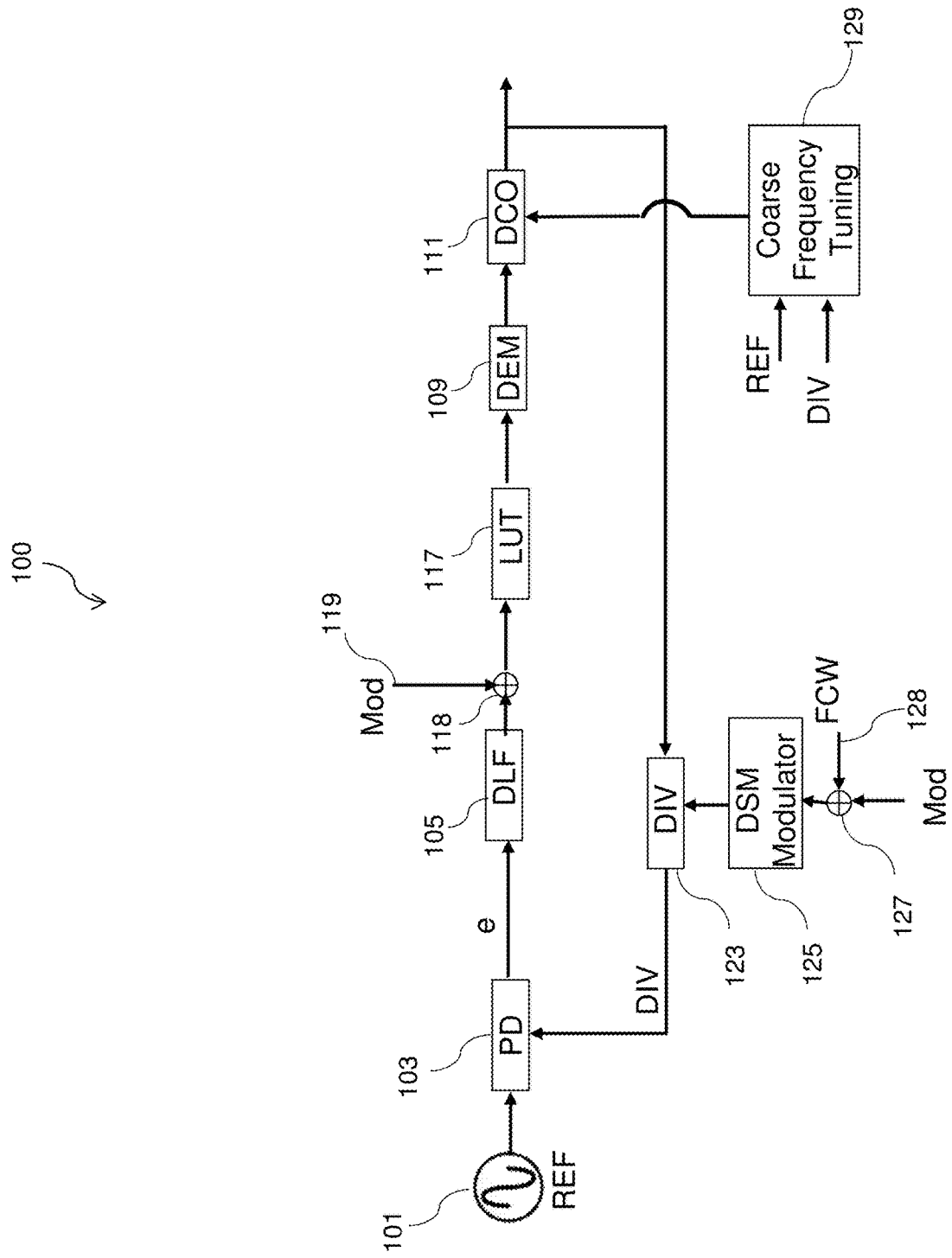
FIG. 8 illustrates an equivalent schematic diagram of the PLL system of FIG. 1 in a closed-loop operation mode.

FIG. 8 illustrates an equivalent schematic diagram of the PLL system 100 of FIG. 1 in the closed-loop operation mode. After the calibration process is finished, the PLL system 100 may enter the closed-loop operation mode by setting the control signal 108 in FIG. 1 such that the output of the LUT 117 is passed through the multiplexer 107 to the DEM circuit 109. In some embodiments, the programmable capacitors 207 in, e.g., the first programmable capacitor bank 208A of the DCO 111/111B is set with a frequency control word (e.g., coarse2) such that the frequency control word C0 for the second programmable capacitor bank 208B corresponds to the carrier frequency Fcar. In addition, the PLL modulation input is applied to the input terminal 119 (and also applied to a first input of the adder 127). In the FMCW radar application, the PLL modulation input changes over time and has the zigzag shape as illustrated by the line 319 in FIGS. 5A and 5B. The PLL modulation input modulates the DCO output frequency and generates a corresponding zigzag shaped (or saw-tooth shaped) DCO output frequency signal.

In FIG. 8, the adder 118 calculates a sum of the PLL modulation input and the output of the loop filter 105. The output of the adder 118 is sent to the LUT 117, and is used as an index to the LUT 117 to find a corresponding calibration data. In the example of FIG. 8, the corresponding calibration data is a modified frequency control word that represents the value at the output of the adder 118 modified by a calibration coefficient to achieve better DCO output linearity. The output of the LUT 117 (e.g., the modified frequency control word) is then sent to the DEM circuit 109, and the output of the DEM circuit 109 is used to set, e.g., the programmable capacitors 207 in the second programmable capacitor bank 208B of the DCO 111/111B to modulate the DCO output frequency.

In some embodiments, after PLL system 100 operates in the closed-loop operation mode for a while, the PLL system 100 exits the closed-loop operation mode and enters the open-loop calibration mode again to update the calibration information, using the same or similar calibration process as described above. The LUT 117 is then updated with the updated calibration information. The PLL system 100 then enters the closed-loop operation mode again and accepts the PLL modulation input to generate the zigzag shaped DCO output frequency signal. The PLL system 100 may thus alternate between the open-loop calibration mode and the closed-loop operation mode to update the calibration information periodically to keep track of the DCO non-linearity characteristics, which may change over time due to, e.g., temperature change of the DCO 111 during operation.

Figure 9:
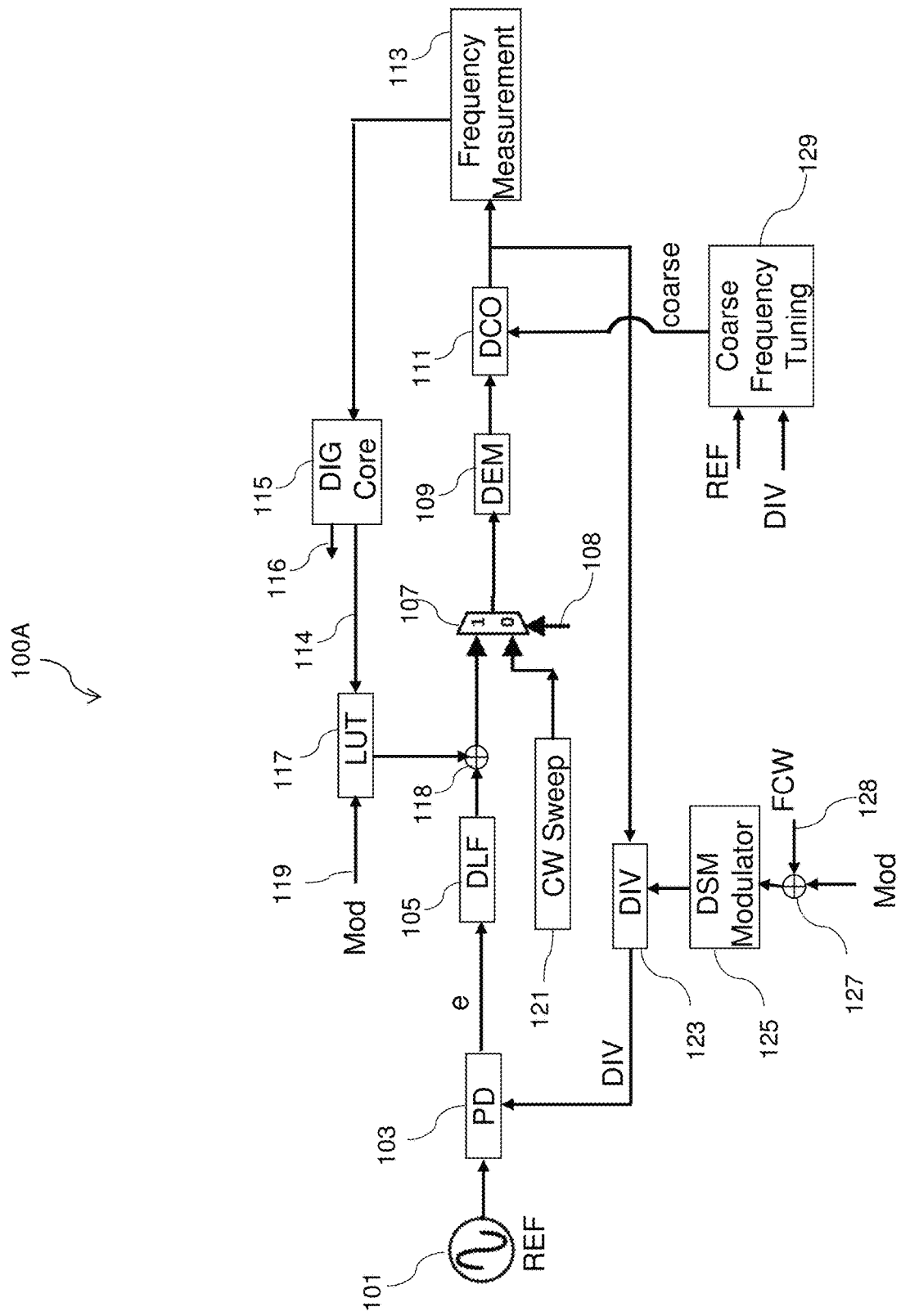
FIG. 9 illustrates a schematic diagram of a phase-locked loop (PLL) system, in another embodiment.

FIG. 9 illustrates a schematic diagram of a phase-locked loop (PLL) system 100A, in another embodiment. The PLL system 100A is similar to the PLL system 100 of FIG. 1, but the PLL modulation input is sent directly to the LUT 117 as the index to find the corresponding calibration data. The output of the LUT 117 and the output of the loop filter 105 are added together by the adder 118, and the output of the adder 118 is sent to the DEM circuit 109 in the closed-loop operation mode. Operation of the PLL system 100A in the open-loop calibration mode is the same as or similar to the PLL system 100, thus details are not repeated.

Figure 10:
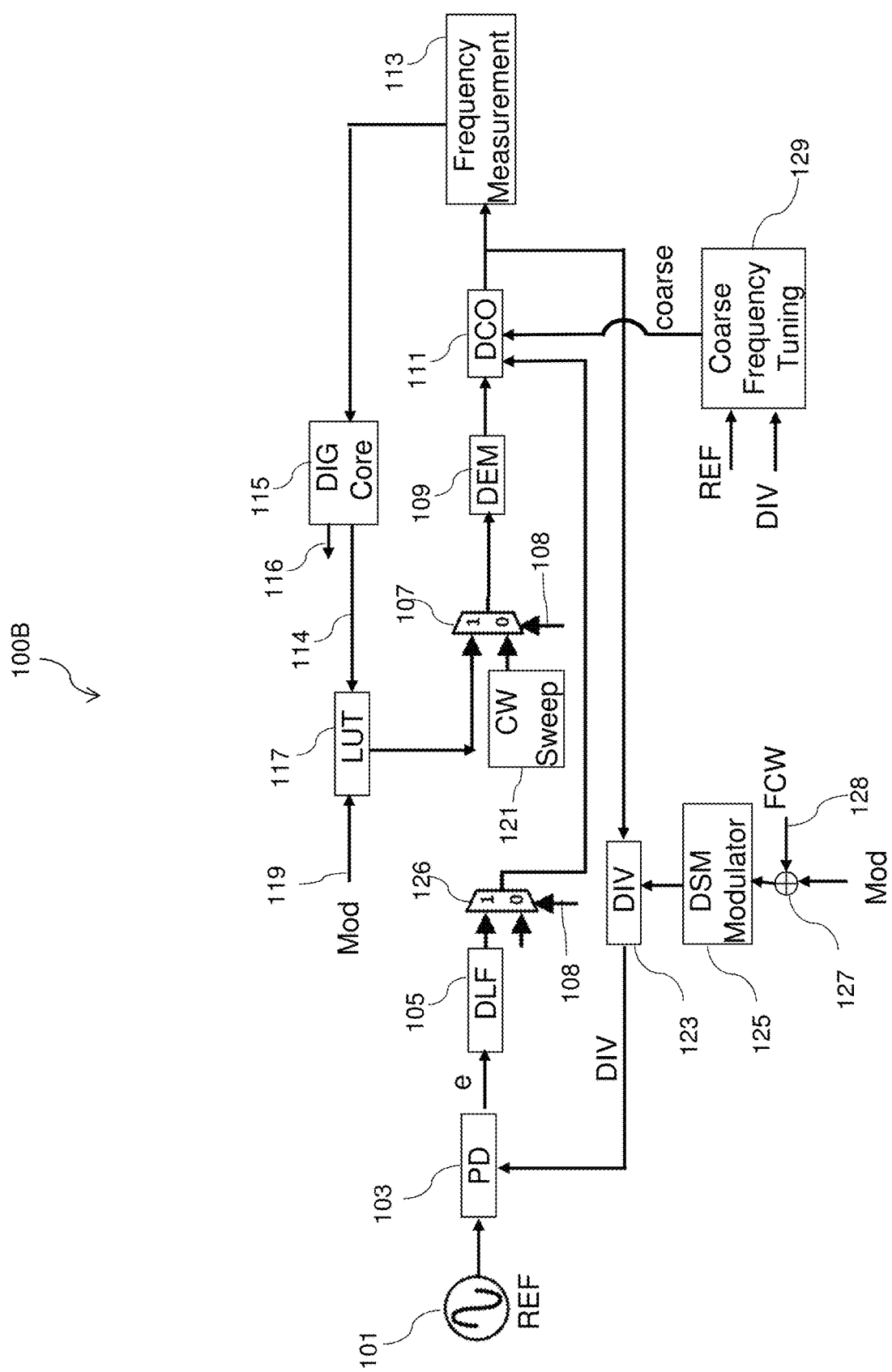
FIG. 10 illustrates a schematic diagram of a phase-locked loop (PLL) system, in yet another embodiment.

FIG. 10 illustrates a schematic diagram of a phase-locked loop (PLL) system 100B, in yet another embodiment. The PLL system 100B is similar to the PLL system 100A of FIG. 9, but the DCO 111 has three programmable capacitor banks, the output of the LUT 117 is sent to the DEM circuit 109 in the closed-loop operation mode, and the output of the DEM circuit 109 is then sent to the DCO 111 to control, e.g., the programmable capacitors 207 in a second programmable capacitor bank of the DCO 111 to modulate the DCO output frequency. In some embodiments, the programmable capacitors 207 in, e.g., a first programmable capacitor bank of the DCO 111 are set by the frequency control word (e.g., $C_0$) that corresponds to the carrier frequency Fcar. In addition, the output of the loop filter 105 is sent to a multiplexer 126 which may be controlled by the same control signal 108 as the multiplexer 107, such that during the closed-loop operation mode, the output of the loop filter 105 is sent to the DCO 111 to control, e.g., the programmable capacitors 207 in a third programmable capacitor bank of the DCO 111. Operation of the PLL system 100B in the open-loop calibration mode is the same as or similar to the PLL system 100, thus details are not repeated. Although not illustrated, the output of the loop filter 105 and the frequency control word (e.g., $C_0$) corresponding to the carrier frequency Fcar may be encoded by, e.g., thermometer encoders before being sent to the DCO 111 to control respective programmable capacitor banks.

Figure 11:
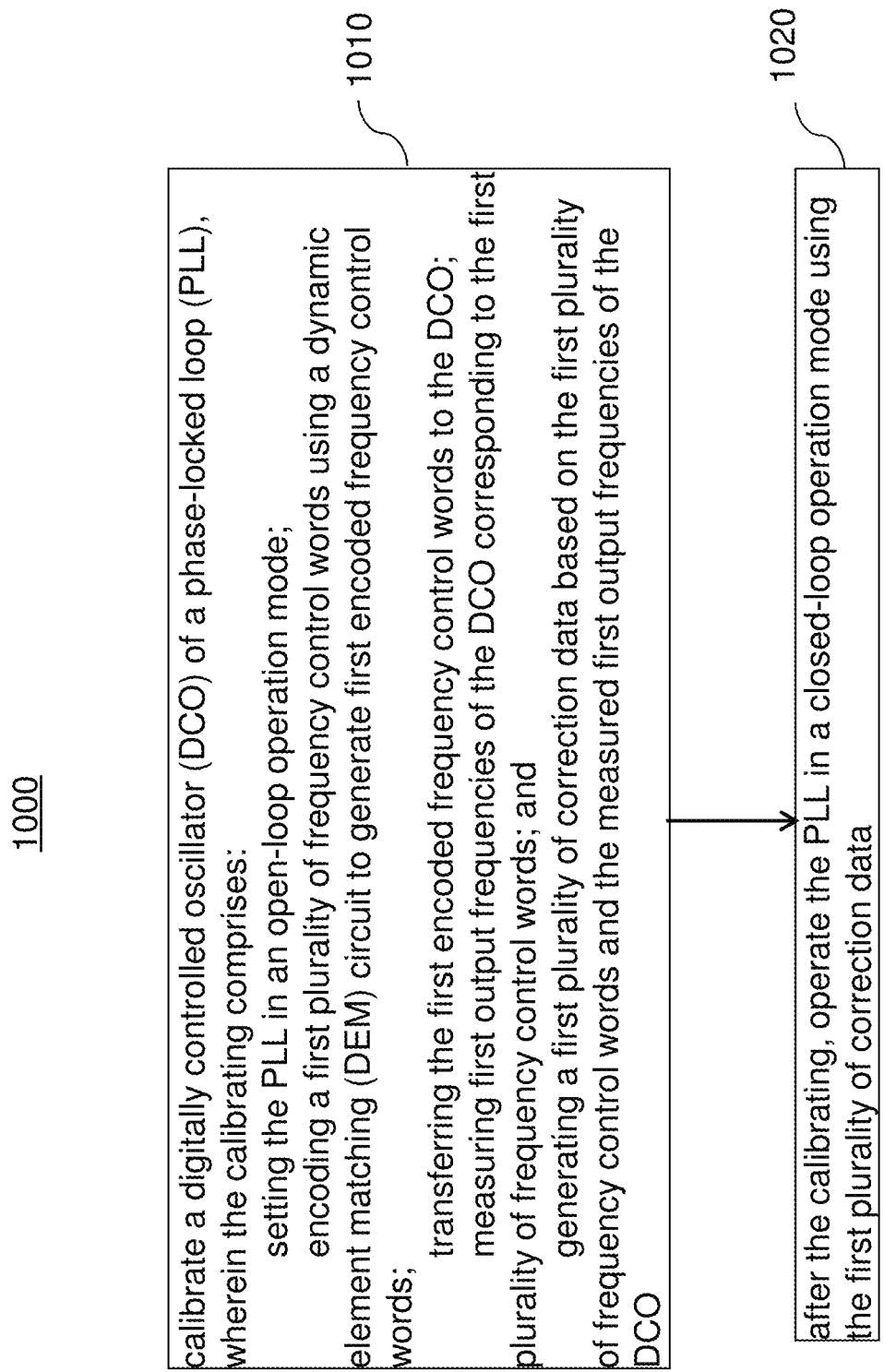
FIG. 11 illustrates a flow chart of a method of operating a PLL, in some embodiments.

FIG. 11 illustrates a flow chart of a method 1000 of operating a PLL, in some embodiments. It should be understood that the embodiment method shown in FIG. 11 is merely an example of many possible embodiment methods.

One of ordinary skill in the art would recognize many variations, alternatives, and modifications. For example, various steps as illustrated in FIG. 11 may be added, removed, replaced, rearranged, or repeated.

Referring to FIG. 11, at block 1010, a digitally controlled oscillator (DCO) of the PLL is calibrated, wherein the calibrating comprises: setting the PLL in an open-loop operation mode; encoding a first plurality of frequency control words using a dynamic element matching (DEM) circuit to generate first encoded frequency control words; transferring the first encoded frequency control words to the DCO; measuring first output frequencies of the DCO corresponding to the first plurality of frequency control words; and generating a first plurality of correction data based on the first plurality of frequency control words and the measured first output frequencies of the DCO. At block 1020, after the calibrating, the PLL is operated in a closed-loop operation mode using the first plurality of correction data.

Embodiments may achieve advantages. For example, by activating the DEM circuit 109 in the open-loop calibration mode, the cell mismatch-induced frequency errors are reshaped and pushed out of the band of interest as, e.g., high-frequency noise. The high-frequency noise may be easily removed by performing a filtering process, such as a polynomial fit of the measured DCO output frequencies. This allows the cell mismatch-induced errors to be resolved without the need of very accurate frequency measurements. Therefore, faster calibration time is achieved since lower calibration accuracy can be allowed to measure the DCO output frequencies during calibration. In radar applications, to guarantee state of the art SFDR performance (e.g., around −100 dBFS) of the base-band signal, a frequency accuracy in the order of 10 Hz may have to be guaranteed for calculation of the calibration information. This leads to a long measurement time during calibration in a range between about 100 ms and about 500 ms, which may be infeasible for radar applications. In addition, the frequency measurements may become invalid over such a long measurement time, since the frequency of the DCO may drift in this long period of measurement time. In contrast, the disclosed method relaxes the require frequency measurement accuracy to about 1 MHz, which leads to about 10 μs measurement time during calibration, thus improving the measurement time allocated for the calibration by a factor 10,000. In addition, the DEM circuit 109, by scrambling (e.g., randomizing) the bit mapping of the scrambler 133 each time, breaks up the code-dependency, thus producing a non-linearity profile which is always the same (e.g. independent from the input sequence of frequency control words) and can be corrected by a set of fixed correction coefficients.

Example embodiments of the present invention are summarized here. Other embodiments can also be understood from the entirety of the specification and the claims filed herein.

Example 1. In an embodiment, a method of operating a phase-locked loop (PLL) comprising a dynamic element matching (DEM)-driven digitally controlled oscillator (DCO) includes calibrating the PLL, wherein calibrating the PLL includes opening a loop of the PLL and performing linearity measurements of the DEM-driven DCO when the loop of the PLL is open and when dynamic matching of the DEM-driven DCO is activated, wherein performing the linearity measurements comprises: applying test control words to the DEM-driven DCO to obtain frequencies in a first range of frequencies; and measuring output frequencies of the DEM-driven DCO corresponding to the test control words. Calibrating the PLL further includes calculating calibration information based on the test control words and the measured output frequencies.

Example 2. The method of Example 1, wherein the calibration information is configured to correct nonlinearities between the output frequencies of the DEM-driven DCO and the test control words.

Example 3. The method of Example 1, further comprising: operating the PLL after calibrating the PLL, the operating comprising: closing the loop of the PLL; and while the loop of the PLL is closed, receiving a PLL modulation input, and adjusting a frequency of the PLL based on the PLL modulation input and the calibration information.

Example 4. The method of Example 3, further comprising: after operating the PLL, calibrating the PLL again to update the calibration information; and operating the PLL with the updated calibration information after calibrating the PLL again.

Example 5. The method of Example 3, wherein adjusting the frequency of the PLL comprises: combining an output of a loop filter of the PLL with the PLL modulation input to form a first combined signal; selecting a first calibration data from the calibration information based on the first combined signal; and adjusting a frequency of the DEM-driven DCO based on the first calibration data.

Example 6. The method of Example 3, wherein adjusting a frequency of the PLL comprises: selecting a first calibration data from the calibration information based on the PLL modulation input; adjusting a first capacitor bank of the DEM-driven DCO based on the first calibration data; and adjusting a second capacitor bank of the DEM-driven DCO based on an output of a loop filter of the PLL.

Example 7. The method of Example 3, wherein adjusting the frequency of the PLL comprises: selecting a first calibration data from the calibration information based on the PLL modulation input; combining the first calibration data with an output of a loop filter of the PLL to form a first combined signal; and adjusting a frequency of the DEM-driven DCO based on the first combined signal.

Example 8. The method of Example 1, wherein calibrating the PLL further comprises: determining a first test control word of the DEM-driven DCO, wherein the first test control word corresponds to a carrier frequency of the DEM-driven DCO, wherein the test control words are chosen such that the carrier frequency is within the first range of frequencies determined by test control words.

Example 9. The method of Example 1, wherein the DEM-driven DCO comprises a dynamic element matching (DEM) circuit and a digitally controlled oscillator (DCO), wherein an output terminal of the DEM circuit is coupled to an input terminal of the DCO.

Example 10. The method of Example 9, wherein the DEM circuit comprises a thermometer code encoder and a scrambler, wherein the thermometer code encoder is configured to encode an input control word of the DEM-driven DCO, and the scrambler is configured to scramble an output of the thermometer code encoder.

Example 11. In an embodiment, a method of operating a phase-locked loop (PLL) includes calibrating a digitally controlled oscillator (DCO) of the PLL, wherein the calibrating comprises: setting the PLL in an open-loop operation mode; encoding a first plurality of frequency control words using a dynamic element matching (DEM) circuit to generate first encoded frequency control words; transferring the first encoded frequency control words to the DCO; measuring first output frequencies of the DCO corresponding to the first plurality of frequency control words; and generating a first plurality of correction data based on the first plurality of frequency control words and the measured first output frequencies of the DCO. The method further includes after the calibrating, operating the PLL in a closed-loop operation mode using the first plurality of correction data.

Example 12. The method of Example 11, wherein operating the PLL in the closed-loop operation mode comprises: receiving a second frequency control word; selecting a correction data from the first plurality of correction data that corresponds to the second frequency control word; encoding a sum of the selected correction data and an output of a loop filter of the PLL using the DEM circuit to generate a second encoded frequency control word; and setting an output frequency of the DCO using the second encoded frequency control word.

Example 13. The method of Example 11, wherein operating the PLL in the closed-loop operation mode comprises: receiving a second frequency control word; selecting a correction data from the first plurality of correction data that corresponds to a sum of the second frequency control word and an output of a loop filter of the PLL; encoding the selected correction data using the DEM circuit to generate a second encoded frequency control word; and setting an output frequency of the DCO using the second encoded frequency control word.

Example 14. The method of Example 11, wherein operating the PLL in the closed-loop operation mode comprises: receiving a second frequency control word; selecting a correction data from the first plurality of correction data that corresponds to the second frequency control word; encoding the selected correction data using the DEM circuit to generate a second encoded frequency control word; adjusting a first capacitor bank of the DCO using the second encoded frequency control word; and adjusting a second capacitor bank of the DCO using an output of a loop filter of the PLL.

Example 15. The method of Example 11, wherein generating the first plurality of correction data comprises: performing a polynomial fit of the measured first output frequencies to generate processed first output frequencies; generating a linear frequency response curve between the first plurality of frequency control words and the processed first output frequencies; computing frequency errors between the processed first output frequencies and the linear frequency response curve; and determining a plurality of pre-distortion values for respective ones of the first plurality of frequency control words to compensate for the computed frequency errors.

Example 16. The method of Example 15, wherein performing the polynomial fit comprising performing the polynomial fit using a polynomial having a polynomial order larger than one.

Example 17. In an embodiment, a digital phase-locked loop (PLL) system includes: a dynamic element matching (DEM) circuit, wherein the DEM circuit is configured to: receive, at an input of the DEM circuit, a frequency control word; and generate, at an output of the DEM circuit, a scrambled frequency control word by encoding and scrambling the frequency control word; a digitally controlled oscillator (DCO), wherein the DCO is configured to receive, at an input of the DCO, the scrambled frequency control word from the DEM circuit, and is configured to output a frequency signal at an output of the DCO; and a digital circuitry configured to generate, in a closed-loop mode, the frequency control word based on at least a PLL modulation input signal and stored calibration information.

Example 18. The PLL system of Example 17, wherein the digital circuitry is configured to generate, in the closed-loop mode, the frequency control word by: combining an output signal of a loop filter of the PLL system with the PLL modulation input signal to form a first combined signal; selecting a first calibration data from the stored calibration information based on the first combined signal; and transferring the first calibration data as the frequency control word to the DEM circuit.

Example 19. The PLL system of Example 17, wherein the digital circuitry is configured to generate, in the closed-loop mode, the frequency control word by: selecting a first calibration data from the calibration information based on the PLL modulation input; combining the first calibration data with an output signal of a loop filter of the PLL system to form a first combined signal; and transferring the first combined signal as the frequency control word to the DEM circuit.

Example 20. The PLL system of Example 17, wherein the digital circuitry is configured to generate, in the closed-loop mode, the frequency control word by: selecting a first calibration data from the calibration information based on the PLL modulation input signal; and transferring the first calibration data as the frequency control word to the DEM circuit, wherein a first capacitor bank of the DCO is adjusted by the scrambled frequency control word from the DEM circuit, wherein the digital circuitry is further configured to adjust a second capacitor bank of the DCO based on an output of a loop filter of the PLL system.

Example 21. The PLL system of Example 17, further comprising a memory device configured to store the calibration information.

Example 22. The PLL system of Example 17, further comprising: a phase error detector; a programmable frequency divider coupled between a first input of the phase error detector and the output of the DCO; a reference frequency signal coupled to a second input of the phase error detector; and a loop filter coupled between an output of the phase error detector and the DEM circuit.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of operating a phase-locked loop (PLL) comprising a dynamic element matching (DEM)-driven digitally controlled oscillator (DCO), the method comprising:
calibrating the PLL, the calibrating comprising:
opening a loop of the PLL and performing linearity measurements of the DEM-driven DCO when the loop of the PLL is open and when dynamic matching of the DEM-driven DCO is activated, wherein performing the linearity measurements comprises:
applying test control words to the DEM-driven DCO to obtain frequencies in a first range of frequencies; and
measuring output frequencies of the DEM-driven DCO corresponding to the test control words; and
calculating calibration information based on the test control words and the measured output frequencies.

2. The method of claim 1, wherein the calibration information is configured to correct nonlinearities between the output frequencies of the DEM-driven DCO and the test control words.

3. The method of claim 1, further comprising:
operating the PLL after calibrating the PLL, the operating comprising:
closing the loop of the PLL; and
while the loop of the PLL is closed,
receiving a PLL modulation input, and
adjusting a frequency of the PLL based on the PLL modulation input and the calibration information.

4. The method of claim 3, further comprising:
after operating the PLL, calibrating the PLL again to update the calibration information; and
operating the PLL with the updated calibration information after calibrating the PLL again.

5. The method of claim 3, wherein adjusting the frequency of the PLL comprises:
combining an output of a loop filter of the PLL with the PLL modulation input to form a first combined signal;
selecting a first calibration data from the calibration information based on the first combined signal; and
adjusting a frequency of the DEM-driven DCO based on the first calibration data.

6. The method of claim 3, wherein adjusting a frequency of the PLL comprises:
selecting a first calibration data from the calibration information based on the PLL modulation input;
adjusting a first capacitor bank of the DEM-driven DCO based on the first calibration data; and
adjusting a second capacitor bank of the DEM-driven DCO based on an output of a loop filter of the PLL.

7. The method of claim 3, wherein adjusting the frequency of the PLL comprises:
selecting a first calibration data from the calibration information based on the PLL modulation input;
combining the first calibration data with an output of a loop filter of the PLL to form a first combined signal; and
adjusting a frequency of the DEM-driven DCO based on the first combined signal.

8. The method of claim 1, wherein calibrating the PLL further comprises:
determining a first test control word of the DEM-driven DCO, wherein the first test control word corresponds to a carrier frequency of the DEM-driven DCO, wherein the test control words are chosen such that the carrier frequency is within the first range of frequencies determined by test control words.

9. The method of claim 1, wherein the DEM-driven DCO comprises a dynamic element matching (DEM) circuit and a digitally controlled oscillator (DCO), wherein an output terminal of the DEM circuit is coupled to an input terminal of the DCO.

10. The method of claim 9, wherein the DEM circuit comprises a thermometer code encoder and a scrambler, wherein the thermometer code encoder is configured to encode an input control word of the DEM-driven DCO, and the scrambler is configured to scramble an output of the thermometer code encoder.

11. A method of operating a phase-locked loop (PLL), the method comprising:
calibrating a digitally controlled oscillator (DCO) of the PLL, wherein the calibrating comprises:
setting the PLL in an open-loop operation mode;
encoding a first plurality of frequency control words using a dynamic element matching (DEM) circuit to generate first encoded frequency control words;
transferring the first encoded frequency control words to the DCO;
measuring first output frequencies of the DCO corresponding to the first plurality of frequency control words; and
generating a first plurality of correction data based on the first plurality of frequency control words and the measured first output frequencies of the DCO; and
after the calibrating, operating the PLL in a closed-loop operation mode using the first plurality of correction data.

12. The method of claim 11, wherein operating the PLL in the closed-loop operation mode comprises:
receiving a second frequency control word;
selecting a correction data from the first plurality of correction data that corresponds to the second frequency control word;
encoding a sum of the selected correction data and an output of a loop filter of the PLL using the DEM circuit to generate a second encoded frequency control word; and
setting an output frequency of the DCO using the second encoded frequency control word.

13. The method of claim 11, wherein operating the PLL in the closed-loop operation mode comprises:
receiving a second frequency control word;
selecting a correction data from the first plurality of correction data that corresponds to a sum of the second frequency control word and an output of a loop filter of the PLL;
encoding the selected correction data using the DEM circuit to generate a second encoded frequency control word; and
setting an output frequency of the DCO using the second encoded frequency control word.

14. The method of claim 11, wherein operating the PLL in the closed-loop operation mode comprises:
receiving a second frequency control word;
selecting a correction data from the first plurality of correction data that corresponds to the second frequency control word;
encoding the selected correction data using the DEM circuit to generate a second encoded frequency control word;
adjusting a first capacitor bank of the DCO using the second encoded frequency control word; and
adjusting a second capacitor bank of the DCO using an output of a loop filter of the PLL.

15. The method of claim 11, wherein generating the first plurality of correction data comprises:
performing a polynomial fit of the measured first output frequencies to generate processed first output frequencies;
generating a linear frequency response curve between the first plurality of frequency control words and the processed first output frequencies;
computing frequency errors between the processed first output frequencies and the linear frequency response curve; and
determining a plurality of pre-distortion values for respective ones of the first plurality of frequency control words to compensate for the computed frequency errors.

16. The method of claim 15, wherein performing the polynomial fit comprising performing the polynomial fit using a polynomial having a polynomial order larger than one.

17. A digital phase-locked loop (PLL) system comprising:
a dynamic element matching (DEM) circuit, wherein the DEM circuit is configured to:
   receive, at an input of the DEM circuit, a frequency control word; and
   generate, at an output of the DEM circuit, a scrambled frequency control word by encoding and scrambling the frequency control word;
a digitally controlled oscillator (DCO), wherein the DCO is configured to receive, at an input of the DCO, the scrambled frequency control word from the DEM circuit, and is configured to output a frequency signal at an output of the DCO; and
a digital circuitry configured to generate, in a closed-loop mode, the frequency control word based on at least a PLL modulation input signal and stored calibration information.

18. The PLL system of claim 17, wherein the digital circuitry is configured to generate, in the closed-loop mode, the frequency control word by:
   combining an output signal of a loop filter of the PLL system with the PLL modulation input signal to form a first combined signal;
   selecting a first calibration data from the stored calibration information based on the first combined signal; and
   transferring the first calibration data as the frequency control word to the DEM circuit.

19. The PLL system of claim 17, wherein the digital circuitry is configured to generate, in the closed-loop mode, the frequency control word by:
   selecting a first calibration data from the calibration information based on the PLL modulation input;
   combining the first calibration data with an output signal of a loop filter of the PLL system to form a first combined signal; and
   transferring the first combined signal as the frequency control word to the DEM circuit.

20. The PLL system of claim 17, wherein the digital circuitry is configured to generate, in the closed-loop mode, the frequency control word by:
   selecting a first calibration data from the calibration information based on the PLL modulation input signal; and
   transferring the first calibration data as the frequency control word to the DEM circuit, wherein a first capacitor bank of the DCO is adjusted by the scrambled frequency control word from the DEM circuit, wherein the digital circuitry is further configured to adjust a second capacitor bank of the DCO based on an output of a loop filter of the PLL system.

21. The PLL system of claim 17, further comprising a memory device configured to store the calibration information.

22. The PLL system of claim 17, further comprising:
   a phase error detector;
   a programmable frequency divider coupled between a first input of the phase error detector and the output of the DCO;
   a reference frequency signal coupled to a second input of the phase error detector; and
   a loop filter coupled between an output of the phase error detector and the DEM circuit.

* * * * *